(12) United States Patent
Arvapalli et al.

(10) Patent No.: US 9,455,000 B2
(45) Date of Patent: Sep. 27, 2016

(54) SHARED GATE FED SENSE AMPLIFIER

(71) Applicant: Apple Inc., Cupertino, CA (US)

(72) Inventors: Ramesh Arvapalli, Santa Clara, CA (US); Greg M. Hess, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/624,605

(22) Filed: Feb. 18, 2015

(65) Prior Publication Data

US 2016/0240231 A1 Aug. 18, 2016

(51) Int. Cl.
G11C 7/06 (2006.01)
G11C 8/10 (2006.01)

(52) U.S. Cl.
CPC ........ G11C 7/062 (2013.01); G11C 8/10 (2013.01)

(58) Field of Classification Search
USPC ........................................... 365/208
See application file for complete search history.

(56) References Cited

U.S. PATENT DOCUMENTS

| | | | | |
|---|---|---|---|---|
| 5,014,246 A * | 5/1991 | Komatsu | ............ | G11C 11/4091 365/189.11 |
| 5,956,285 A * | 9/1999 | Watanabe | ............ | G11C 8/16 365/196 |
| 6,222,777 B1 * | 4/2001 | Khieu | ............ | G11C 7/18 365/154 |
| 6,246,614 B1 * | 6/2001 | Ooishi | ............ | G11C 7/1072 365/191 |
| 6,324,110 B1 * | 11/2001 | Leung | ............ | G11C 7/1006 365/203 |
| 6,359,821 B1 * | 3/2002 | Roohparvar | ............ | G11C 7/14 365/189.11 |
| 6,418,063 B1 * | 7/2002 | Seitsinger | ............ | G11C 7/10 365/189.05 |
| 7,215,595 B2 * | 5/2007 | Kiehl | ............ | G11C 7/06 365/189.05 |
| 7,339,850 B2 * | 3/2008 | Morishima | ............ | G11C 7/1051 365/154 |
| 8,437,215 B2 | 5/2013 | Cheng et al. | | |
| 8,553,482 B2 | 10/2013 | Chow | | |
| 2008/0008011 A1 * | 1/2008 | Moon | ............ | G11C 7/08 365/189.02 |
| 2012/0188838 A1 * | 7/2012 | Cheng | ............ | G11C 7/12 365/230.06 |
| 2013/0148453 A1 * | 6/2013 | John | ............ | G11C 7/08 365/210.1 |
| 2013/0229877 A1 * | 9/2013 | Seningen | ............ | G11C 7/06 365/189.02 |
| 2013/0265836 A1 * | 10/2013 | Seningen | ............ | G11C 7/08 365/194 |
| 2014/0126312 A1 * | 5/2014 | Hess | ............ | G11C 29/026 365/201 |
| 2014/0198594 A1 * | 7/2014 | McCombs | ............ | G11C 7/12 365/203 |

* cited by examiner

*Primary Examiner* — Anthan Tran
*Assistant Examiner* — Mushfique Siddique
(74) *Attorney, Agent, or Firm* — Meyertons, Hood, Kivlin, Kowert & Goetzel, P.C.

(57) ABSTRACT

A first plurality of storage cells may be coupled to a first pair of data lines, and a second plurality of storage cells may be coupled to a second pair of data lines. Each storage cell in the first plurality of storage cells may be configured to generate a first output signal on the first pair of data lines in response to an assertion of a respective one of first plurality of selection signals, and each storage cell in the second plurality of storage cells may be configured to generate a second output signal on the second pair of data lines in response to the assertion of a respective one of a second plurality of selection signals. Circuitry may assert a given selection signal from either the first or second plurality of selection signals. An amplifier circuit may amplify either the first or second output signal.

10 Claims, 6 Drawing Sheets

SHARED GATE FED SENSE AMPLIFIER

BACKGROUND

1. Technical Field

Embodiments described herein relate to integrated circuits, and more particularly, to techniques sensing data stored in data storage cells.

2. Description of the Related Art

Memories typically include a number of data storage cells composed of interconnected transistors fabricated on a semiconductor substrate. Such data storage cells may be constructed according to a number of different circuit design styles. For example, the data storage cells may be implemented as a single transistor coupled to a capacitor to form a dynamic storage cell. Alternatively, cross-couple inverters may be employed to form a static storage cell or a floating gate metal-oxide semiconductor field-effect transistor (MOSFET) may be used to create a non-volatile storage cell.

In various memory architectures, groups of data storage cells are arranged in arrays of rows and columns. Each data storage cell within a particular column is coupled to a data line (also referred to herein as a "bit line"). Additionally, each data storage cell within the particular column is coupled to a respective selection signal (also referred to herein as a "word line").

During a read operation, a particular data storage cell is selected by activating its corresponding selection signal. The selected data storage cell may then generate a small signal on its associated data line. An amplifier (commonly referred to as a "sense amplifier") is employed to amplify the small signal. In some cases, the amplification process results in a digital signal corresponding to the data stored in the selected data storage cell. Other memory architectures may employ multiple stages of amplification.

SUMMARY OF THE EMBODIMENTS

Various embodiments of a computing system are disclosed. Broadly speaking, a circuit and a method are contemplated in which a first subset of a plurality of data storage cells is coupled to a first pair of data lines and a second subset of the plurality of data storage cells is coupled to a second pair of data lines. Each data storage cells of the first subset may be configured to generate a first differentially encoded output signal on the first pair of data lines in response to an assertion of a respective one of a first plurality of selection signals, and each data storage cell of the second subset may be configured to generate a second differentially encoded output signal on the second pair of data lines in response to an assertion of a respective one of a second plurality of selection signals. Circuitry may be configured to assert a given selection signal from either the first or second plurality of selection signals dependent upon an address value. An amplifier circuit may be configured to amplify the first and the second differentially encoded output signals.

In one embodiment, wherein the address value may be included in a received read command. The circuitry may be further configured to decode the address value.

In a further embodiment, the amplifier circuit includes a first and second pair of metal-oxide semiconductor field-effect transistors (MOSFETs). A gate terminal of each MOSFET in the first pair of MOSFETs is coupled to a respective one of the first pair of data lines, and a gate terminal of each MOSFET in the second pair of MOSFETs is coupled to a respective one of the second pair of data lines.

BRIEF DESCRIPTION OF THE DRAWINGS

The following detailed description makes reference to the accompanying drawings, which are now briefly described.

Figure 1:
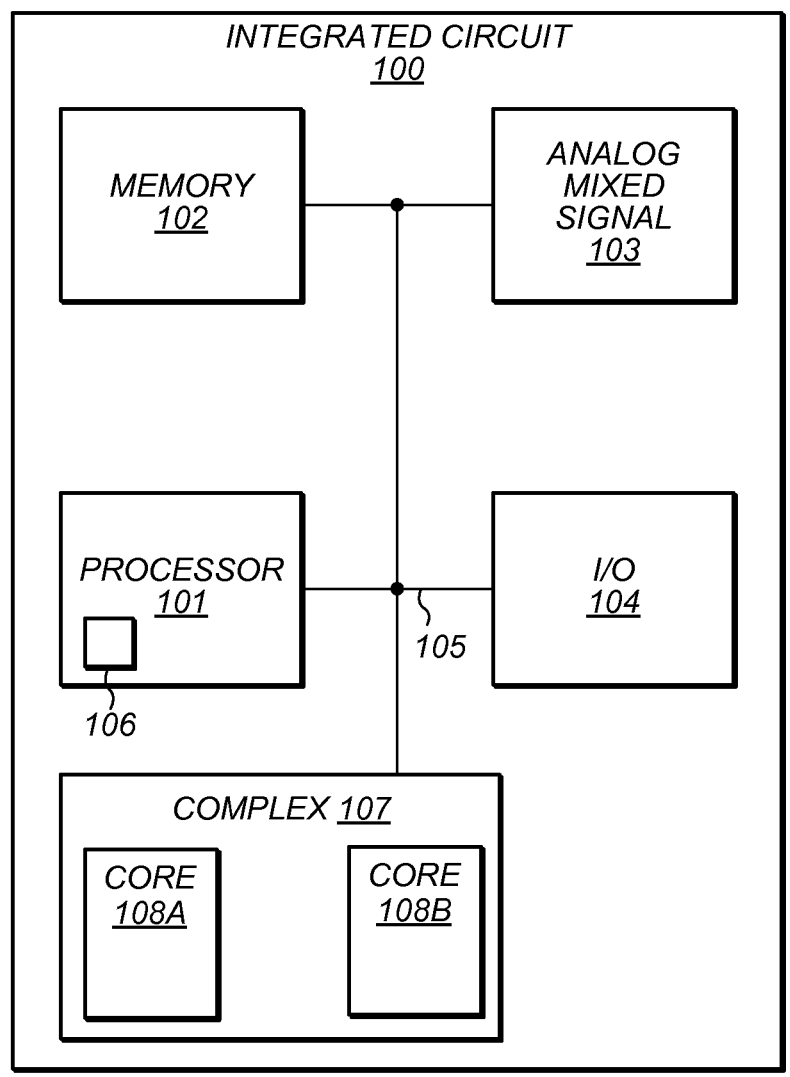
FIG. 1 illustrates an embodiment of an integrated circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

In memory designs, sense amplifiers are typically employed to amplify small signals generated by selected data storage cells during read operations. Such amplifiers convert the small signals to signals with larger dynamic range or directly into digital logic levels. Depending on a particular memory design, various types of sense amplifiers may be used. For example, in some designs, analog amplifiers may be employed, while, in other designs, latch-based amplifiers may be used.

In various designs, a single amplifier is used for a corresponding column in the memory array. The data line (or data lines in cases where differential signaling is employed) may be coupled to a gate terminal of one or more MOSFETs included in the amplifier. Undesirable use of area may result from such arrangements. To improve area usage, a sense amplifier may be shared between two adjacent banks of memory cells in the memory. Such sharing may employ additional multiplex circuits, which increase the capacitive load on the data lines and dynamic power consumption. The embodiments illustrated in the drawings and described below may provide techniques for sharing a sense amplifier between multiple banks within a memory while limiting any increase to the capacitive load of the data lines.

A block diagram of an integrated circuit is illustrated in FIG. 1. In the illustrated embodiment, the integrated circuit 100 includes a processor 101, and a processor complex (or simply a "complex") 107 coupled to memory block 102, and analog/mixed-signal block 103, and I/O block 104 through internal bus 105. In various embodiments, integrated circuit 100 may be configured for use in a desktop computer, server, or in a mobile computing application such as, e.g., a tablet or laptop computer.

As described below in more detail, processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include one or more energy modeling units 106 which may be configured to estimate both dynamic and leakage power consumption on a cycle and execution thread basis. In other embodiments, any functional unit, such as, e.g., I/O block 104, may include an energy modeling unit.

Complex 107 includes processor cores 108A and 108B. Each of processor cores 108A and 108B may be representative of a general-purpose processor configured to execute software instructions in order to perform one or more computational operations. Processor cores 108A and 108B may be designed in accordance with one of various design styles. For example, processor cores 108A and 108B may be implemented as an ASIC, FPGA, or any other suitable processor design.

Memory block 102 may include any suitable type of memory such as a Dynamic Random Access Memory (DRAM), a Static Random Access Memory (SRAM), a Read-only Memory (ROM), Electrically Erasable Programmable Read-only Memory (EEPROM), or a non-volatile memory, for example. It is noted that in the embodiment of an integrated circuit illustrated in FIG. 1, a single memory block is depicted. In other embodiments, any suitable number of memory blocks may be employed.

Analog/mixed-signal block 103 may include a variety of circuits including, for example, a crystal oscillator, a phase-locked loop (PLL), an analog-to-digital converter (ADC), and a digital-to-analog converter (DAC) (all not shown). In other embodiments, analog/mixed-signal block 103 may be configured to perform power management tasks with the inclusion of on-chip power supplies and voltage regulators. Analog/mixed-signal block 103 may also include, in some embodiments, radio frequency (RF) circuits that may be configured for operation with wireless networks. I/O block 104 may be configured to coordinate data transfer between integrated circuit 100 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O block 104 may be configured to implement a version of Universal Serial Bus (USB) protocol or IEEE 1394 (Firewire®) protocol.

I/O block 104 may also be configured to coordinate data transfer between integrated circuit 100 and one or more devices (e.g., other computer systems or integrated circuits) coupled to integrated circuit 100 via a network. In one embodiment, I/O block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 104 may be configured to implement multiple discrete network interface ports.

It is noted that the embodiment illustrated in FIG. 1 is merely an example. In other embodiments, different functional units and different configurations of functional units are possible and contemplated.

Figure 2:
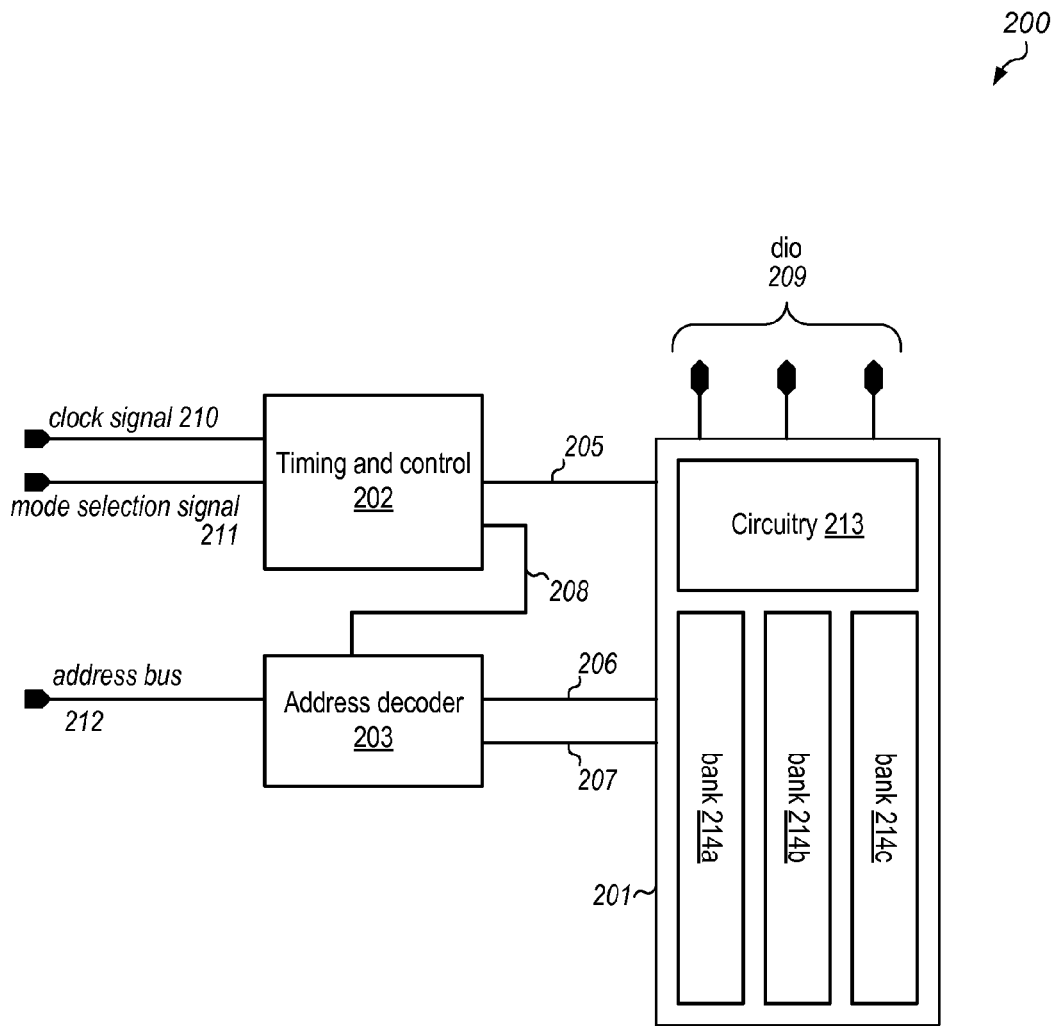
FIG. 2 illustrates an embodiment of a memory unit.

Turning now to FIG. 2, an embodiment of a memory is illustrated. In the illustrated embodiment, memory 200 includes data I/O ports 209 denoted "dio," an address bus input 212 denoted "add," mode selection inputs 211 denoted "mode," and a clock input 210 denoted "clk." Memory 200 may, in various embodiments, correspond to 102 of integrated circuit 100 as illustrated in FIG. 1.

In the illustrated embodiment, memory 200 includes array 201, timing and control unit 202, and address decoder 203. Timing and control unit 202 is coupled to provide a decoder enable signal 208 to address decoder 203 and control signals 205 to array 201. In some embodiments, control signals 205 may include a pre-charge signal, and a sense amplifier enable signal.

In the illustrated embodiment, array 201 includes banks 214a, 214b, and circuitry 213. Each of banks 214a-c includes multiple data storage cells (not shown). The data storage cells may be arranged in rows and columns, and may be of any suitable type, such as, SRAM data storage cells, for example. Each row of data storage cells may be coupled to a respective one of row selects 206. Data read from a given subset of data storage cells may be amplified and output through data I/O ports 209. Data to be stored in a particular group of data storage cells may be input through data I/O ports, latched, and the written into selected data storage cells.

Circuitry 213 may include one or more amplifiers and input/output circuits (not shown). In some embodiments, the amplifiers included in circuitry 213 are coupled to individual columns of data storage cells in banks 214a-c. The amplifiers may, in other embodiments, be shared between banks, i.e., a given amplifier may be configured to amplify data from a selected data storage cell in either of two different banks. In various embodiments, the input/output circuits may include additional amplifiers configured to provide a second level of amplification.

Timing and control unit 202 may be configured to generate control signals 205 and decoder enable signal 208 dependent on clock signal 210 and mode selection signal 211. Control signals 205 may, in some embodiments, include signals for enabling and operating sense amplifiers, data input and output latches, write driver circuits and the like. Decoder enable signal 208 may activate or enable address decoder 203. In some embodiments, timing and control unit 202 may assert an amplifier enable signal after a predetermined period of time has elapsed from the assertion of decoder enable signal 208.

Timing and control unit 202 may be designed according to one of various design styles. In some embodiments, timing and control unit 202 may include multiple latches or flip-flops configured to form a sequential logic circuit or state machine. In other embodiments, timing and control unit 202 may include a general-purpose processor configured to execute software instructions stored in a memory separate from memory 200.

Address decoder 203 is coupled to provide row selects 206 and column selects 207 to sub-arrays 201a, 201b, and 201c, in response to the assertion of decoder enable signal 208 and the address value on address bus 212. In various embodiments, address decoder 203 may employ multiple stages of logic gates, or other suitable circuits, for translating the address value on address bus 212 into a given one or row selects 206 and a given one of column selects 207.

The embodiment depicted in FIG. 2 is merely an example. In various embodiments, different numbers of sub-arrays, different numbers of row and column selects may be employed.

Figure 3:
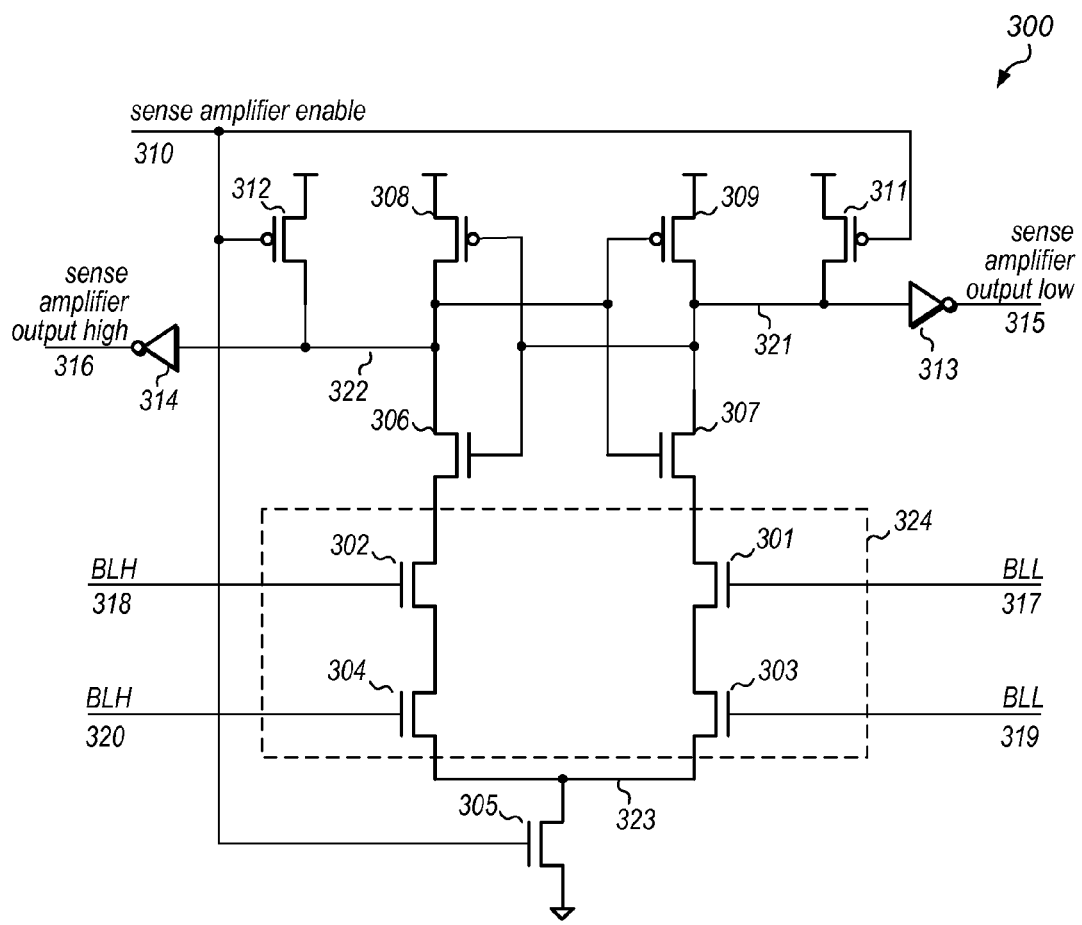
FIG. 3 illustrates an embodiment of a sense amplifier circuit.

An embodiment of a sense amplifier is illustrated in FIG. 3. In some embodiments, sense amplifier 300 may correspond to an amplifier included in circuitry 213 as depicted in FIG. 2. In the illustrated embodiments, sense amplifier 300 includes pull-up devices 308, 309, 311, and 312, pull-down device 305, devices 301-304, and devices 306-309. Sense amplifier 300 also includes inverters 313 and 314. Although depicted as single devices, it is noted that pull-up devices 311 and 312, pull-down device 305, devices 301-304, and devices 306-209 may each be implemented as multiple transconductance devices coupled in parallel.

Control terminals (also referred to herein as "gate terminals") for pull-up devices 312 and 311, as well as, pull-down device 305 are coupled to sense amplifier enable 310. In some embodiments, a low logic level on sense amplifier enable 310 deactivates pull-down device 305 and activates pull-up devices 311 and 312 thereby charging nodes 321 and 322 to a voltage at or near that of the power supply. A high logic level on sense amplifier enable 310 may deactivate pull-up devices 311 and 312, and activate pull-down device 305 thereby discharging node 323 creating a virtual ground.

It is noted that in various embodiments, a pull-up path (also referred to herein as a pull-up network) may include one or more transistors coupled, in a series fashion, parallel fashion, or combination thereof, between a circuit node and a power supply. It is further noted that a pull-down path (also referred to herein as a pull-down network) may include one or more transistors coupled, in a series fashion, parallel fashion, or combination thereof, between a circuit node and ground or a circuit node at or near ground potential As described and used herein, "low," "logic 0" or "low logic level" refers to a voltage at or near ground and that "high," "logic 1" or "high logic level" refers to a voltage level sufficiently large to turn on a n-channel MOSFET and turn off a p-channel MOSFET. In other embodiments, different technology may result in different voltage levels for "low" and "high."

The input of inverter 314 is coupled to node 322 and its output is coupled to sense amplifier output high 316. Additionally, the input of inverter 313 is coupled to node 321 and its output is coupled to sense amplifier output low 315. During operation, each of inverters 314 and 313, amplify and invert the logical sense of voltage levels on nodes 322 and 321, respectively, to generate voltage levels on sense amplifier output high 316 and sense amplifier output low 315. In some embodiments, the voltage level on sense amplifier output high 316 may correspond to the logic state of data store in a particular data storage cell, while the voltage level on sense amplifier output low 315 may correspond to the complement of the logic state in the particular data storage cell.

It is noted that static complementary metal-oxide-semiconductor (CMOS) inverters, such as those shown and described herein, may be a particular embodiment of an inverting amplifier that may be employed in the circuits described herein. However, in other embodiments, any suitable configuration of inverting amplifier that is capable of inverting the logical sense of a signal may be used, including inverting amplifiers built using technology other than CMOS.

Gate terminals of devices 301 and 302 are coupled to BLLA 317 and BLHA 318, respectively. In various embodiments, BLLA 317 and BLHA 318 correspond to a pair of data lines from a given block in a memory array, such as, block 214a, for example. A differentially encoded signal generated by a selected data storage cell included in the given block may be represented as a difference in voltage levels on BLLA 317 and BLHA 318. When data lines are coupled to the gate terminals of devices included in a sense amplifier, the amplifier is referred to as being "gate coupled" or "gate fed."

In a similar fashion, devices 303 and 304 are coupled to BLLB 319 and BLHB 320, respectively. BLLB 319 and BLHB 320 may, in some embodiments, correspond to a pair of data lines from a different block within the memory array. As above, data from a selected data storage cell in the different block may be represented as a difference in voltage levels on BLLB 319 and BLHB 320. By coupling data lines from two different banks to gate terminals of different pairs of devices within a sense amplifier, the sense amplifier may, in some embodiments, be shared between the two different banks without the use of an intervening decoder or other isolation circuitry resulting in reduced silicon area and reduced power consumption realized from a lower capacitive load.

Since the gate terminals of devices 301 through 304 are coupled to data lines from a pair of blocks, they are commonly referred to as "input devices" and are included in input structure 324. As described below in more detail, different data lines may be coupled to the gate terminals of different input devices. In the present embodiment, the data lines from one block are coupled to the top devices of input structure 324 (devices 302 and 301) and the data lines from the other block are coupled to the bottom devices of input structure 324 (devices 304 and 303).

Gate terminals of pull-up devices 307 and 309 are coupled to node 322, and gate terminals of devices 306 and 308 are coupled to node 321. Drain terminals of pull-up devices 307 and 309 are coupled to node 321, and drain terminals of devices 306 and 308 are coupled to node 322. The aforementioned arrangement of devices is commonly referred to as "cross coupled devices" and provides regenerative feedback used in the operation of sense amplifier 300 as described below.

Prior to operation, sense amplifier enable 310 is set to a low logic level thereby initializing nodes 321 and 322 to a voltage level at or near that of the power supply. This process is commonly referred to as "pre-charging" the amplifier. While the pre-charge is being performed, the data lines (BLLA 317, BLHA 318, BLLB 319, and BLHB 320) are initialized (or pre-charged) to a voltage level at or near that of the power supply by initialization circuits within the memory array. The high voltage level on the data lines activates each of devices 301 through 304.

During a read operation, a particular data storage cell is selected in a given bank of the memory array. The selection is performed through the assertion of row and column selection signals in response to decoding an address associated with the read operation. For the purposes of illustration, it will be assumed that a data storage cell coupled to BLLA 317 and BLHA 318 is selected. Once the data storage cell has been selected, it begins to sink a small current from either BLLA 317 or BLHA 318 dependent upon the data stored in the data storage cell. Again, for purposes of illustration, it will be assumed that the small current will sunk from BLLA 317.

As the current is sunk from BLLA 317, the voltage level on BLLA 317 begins to drop from the pre-charged level. The voltage level on BLHA 318 remains close to the pre-charge level since no current (other than a small amount of leakage current) is being sunk from the node. Since a data storage cell coupled to BLLB 319 and BLHB 320 has not been selected, the voltage levels on these nodes remains close to the pre-charge level.

After a period of time has elapsed since the selection of the data storage cell (commonly referred to as "development time"), a timing and control unit, such as, e.g., timing and control unit 202, may transition sense amplifier enable 310 from a low logic level to a high logic level. Such a transition deactivates pull-up devices 311 and 312, and activates pull-down device 305, discharging node 323 to ground. Since devices 303 and 304 are active due to high logic levels on BLLB 319 and BLHB 320, respectively, source terminals of devices 301 and 302 are discharged to ground through devices 303 and 304, respectively.

Since the voltage level of BLLA 317 is lower than, device 301 conducts less current than device 302 resulting in a voltage level on a source terminal of device 306 to discharge to ground more rapidly than a voltage level on a source terminal of device 307. The regenerative feedback formed between pull-up devices 308 and 309, and devices 306 and 307 results in the voltage level on node 322 transitioning to a low logic level resulting in a high logic level on sense amplifier output high 316. Although the above describe assumes a particular data polarity in a particular data storage cell within a given bank, any suitable combination of data polarity, data storage cell, and bank is possible.

It is noted that the embodiment illustrated in FIG. 3 is merely an example. In other embodiments, different numbers of devices and different configurations of devices may be employed.

Figure 4:
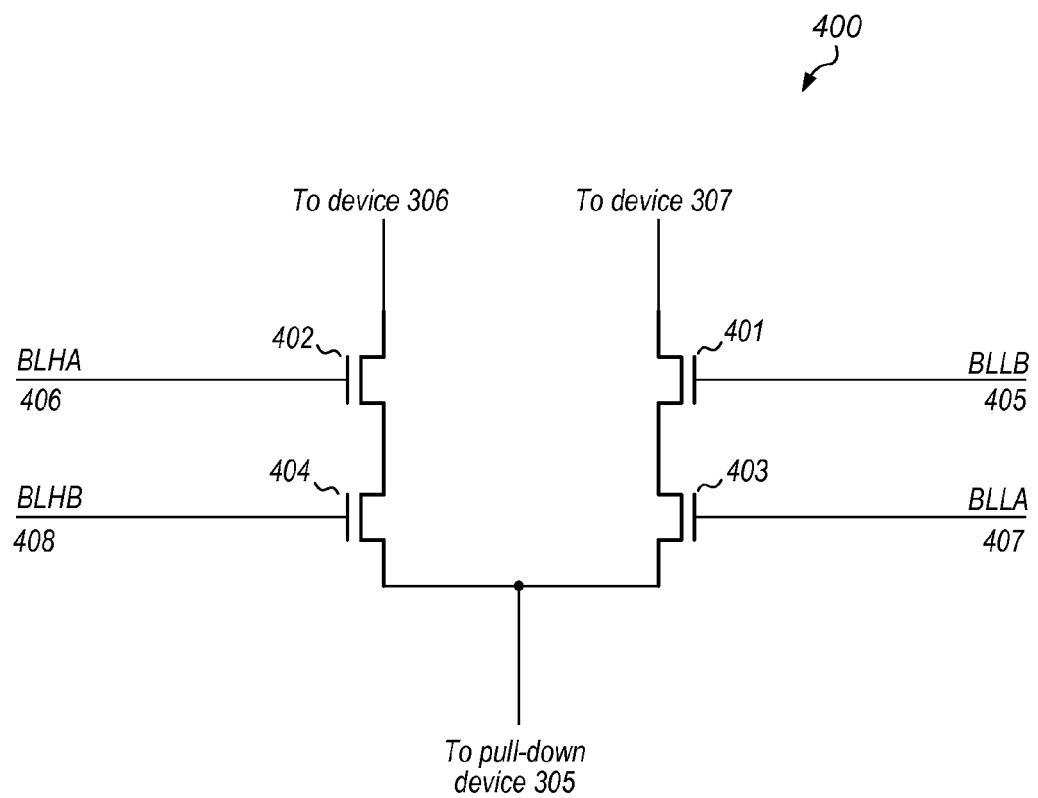
FIG. 4 illustrates a block diagram of an embodiment of an input structure to a sense amplifier.

As mentioned above, the data lines from different blocks may be coupled to a shared sense amplifier in a variety of configurations. One example connection configuration is illustrated in FIG. 4. In some embodiments, input structure 400 may correspond to input structure 324 of sense amplifier 300 as depicted in FIG. 3.

Input structure 400 includes device 401 through 404, which, in various embodiments, may correspond to devices 301 through 304 of input structure 324 of sense amplifier 300 as illustrated in FIG. 3. Devices 402 and 401 may be coupled to devices 306 and 307 of sense amplifier 300, respectively. Additionally, devices 402 and 401 are coupled to devices 404 and 403, respectively. Each of devices 403 and 404 may be coupled to device 305 of sense amplifier 300 as illustrated in FIG. 3.

In contrast to the embodiment illustrated in FIG. 3, gate terminals of device 402 and 403 are coupled to data lines from a particular block, namely BLHA 406 and BLLA 407, respectively. In a similar fashion, data lines from a different block, BLHB 408 and BLLB 405, are coupled to the gate terminals of devices 404 and 401, respectively.

Slight variation in the electrical characteristics of input devices 401 through 404 may result in different sensing characteristics, such as, e.g., sense time, dependent upon which set of data lines are active. These differences in characteristics are commonly referred to as "offset." Such diagonal data line connections, as described above, may create similar offset in the sense amplifier irrespective of which block is active. By having similar offsets for either banks' data lines, sensing characteristic may, in various embodiments, be similar irrespective of which block is active.

It is noted that the embodiment illustrated in FIG. 4 is merely an example. In other embodiments, different connection configurations of data lines to input devices are possible and contemplated.

Figure 5:
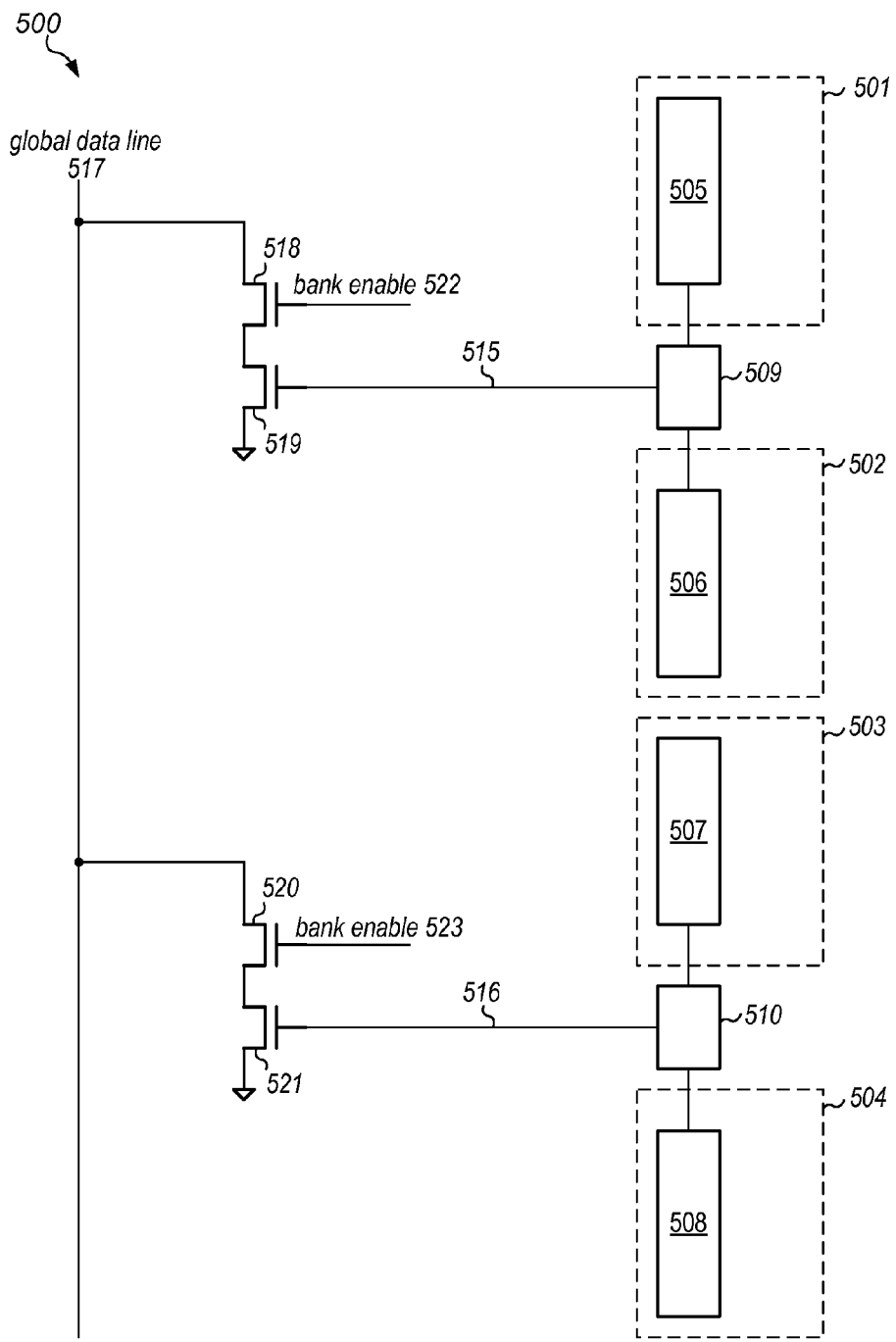
FIG. 5 illustrates a block diagram of an embodiment of a shared sense amplifier.

In some cases, an additional level of decoding and/or amplification may be employed before generating a final output of a memory. An embodiment of such a memory array is illustrated in FIG. 5. Memory array 500 may, in some embodiments, correspond to array 201 as depicted in FIG. 2. In the illustrated embodiment, memory array 500 includes banks 501-504, sense amplifiers 509 and 510, devices 518 and 520, and pull-down devices 521.

Each of banks 501-504 may correspond to any of banks 214a-c as illustrated in FIG. 2. Banks 501 and 502 includes columns 505 and 506, respectively. In a similar fashion, banks 503 and 504 include columns 507 and 508. Each of columns 505 through 508 include multiple data storage cells. The data storage cells within a given column are each coupled to a common data line (or pair of data lines in cases where differentially signaling is employed) and a respective selection line.

In some embodiments, sense amplifiers 509 and 510 may each correspond to amplifier 300 as illustrated in FIG. 3. Sense amplifier 509 is coupled to data lines from columns 505 and 506, and sense amplifier 510 is coupled to data lines from columns 507 and 508. An output of sense amplifier 509 is coupled to node 515 and, in a similar fashion, an output of sense amplifier 510 is coupled to node 516.

Gate terminals of pull-down devices 519 and 521 are coupled to nodes 515 and 516, respectively. Moreover, drain terminals of pull-down devices 519 and 521 are coupled to source terminals of devices 518 and 520, respectively. Drain terminals of devices 518 and 520 are, in turn, coupled to global data line 517. Gate terminals of devices 518 and 520 are coupled to bank enable 522 and bank enable 523, respectively.

During operation, global data line 517 is pre-charged to a voltage level at or near that of the power supply. A data storage cell in one of columns 505 through 508 is then selected. A signal resulting from the selection of a data storage cell may then be amplified by one of sense amplifiers 509 or 510. For example, if a data storage cell in one of columns 505 or 506 is selected then sense amplifier 509 will amplify the resultant signal.

One of bank enable signal 522 or bank enable signal 523 may also be set to a high logic level, thereby enabling the corresponding one of devices 518 or 520. Continuing with the above example, since a data storage cell from one of columns 505 or 506 was selected, bank enable signal 522 would be set to a high logic level and bank enable signal 523 would remain at a low logic enable, disabling device 520.

Bank enable signals 522 and 523 may, in various embodiments, be generated by a decoder, such as, address decoder 503, for example.

If a particular bank enable signal and associated sense amplifier output are both at high logic levels, then global data line 517 may be discharge from its pre-charge voltage level through the two series devices. Again, continuing with the above example, if a voltage level of node 515 is high, then devices 519 and 518 are both active, and global data line 517 is discharged. Alternatively, if the voltage level on node 515 is low, then pull-down device 519 is inactive, and global data line 517 remains at its pre-charge voltage level.

It is noted that the embodiment illustrated in FIG. 5 is merely an example. In other embodiments, different numbers of banks and sense amplifiers are possible and contemplated.

Figure 6:
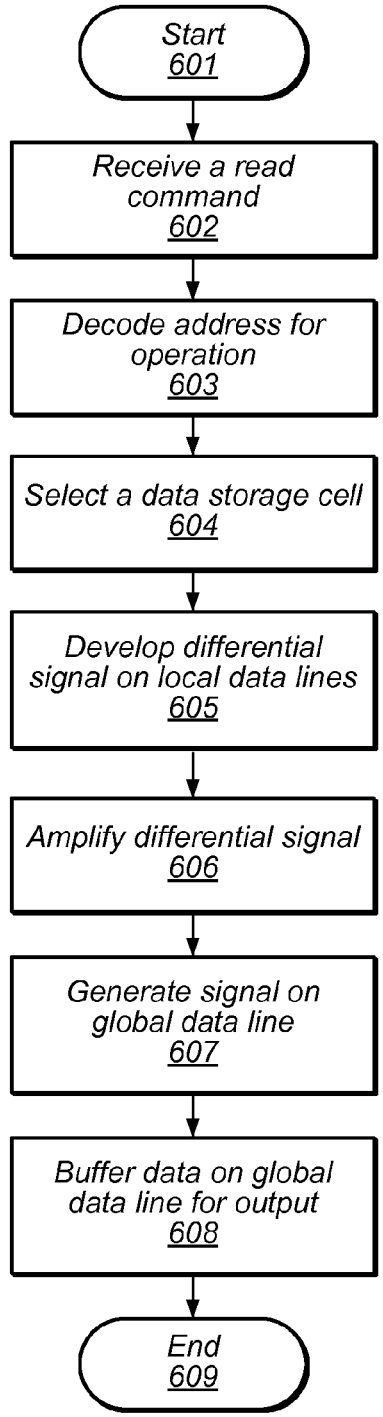
FIG. 6 depicts a flow diagram illustrating an embodiment of a method for amplifying data from a data storage cell.

A flow diagram illustrating an embodiment of a method for amplifying data in a memory is illustrated in FIG. 6. Referring collectively to the memory 200 as illustrated in FIG. 2, and the flow diagram of FIG. 6, the method begins in block 601.

A read command may then be received (block 602). In various embodiments, memory 200 receives the read command from a processor, such as processor 101 as illustrated in FIG. 1. The read command includes, in some embodiments, an address specifying one or more data storage cells to access. Address decoder 203 may then decode the received address (block 603). In some embodiments, address decoder 203 may separately decode portions of the received address to generate separate row and column, and bank selection signals.

Once the address has been decoded, a set of selection signals, row, column, and bank selection signals, for example, is asserted, selecting a data storage cell (block 604). The selected data storage cell may then develop a signal on data lines coupled to the selected data storage cell (block 605). The signal may be generated by the addition or removal, by the selected data storage cell, of a small amount of charge from the data lines. Alternatively, the selected data storage cell may sink a small current from one of the data lines.

The signal generated by the data storage cell may then be amplified (block 606). In some embodiments, a differential gate fed sense amplifier, such as, e.g., sense amplifier 300, may amplify a difference between voltage levels on a pair of data lines. A single-ended sense amplifier may, in other embodiments, be employed in memory architectures where the data storage cells do not generate a differentially encoded output signal.

An output of the sense amplifier may then be transferred to a global data line (block 607). In various embodiments, the global data line may be pre-charged to a voltage level at or near that of a power supply. As described above in regard to FIG. 5, the global data line may then be discharge dependent upon the output of the sense amplifier. In some embodiments, the discharge of the global data line may be further dependent upon a bank enable signal generated by an address decoder.

The voltage level of the global data line may then be buffered for output from the memory (block 608). In some embodiments, one or more inverters may be coupled in series to provide sufficient capability to drive an intended load for the memory. Each inverter in the series of inverters may increase in size, thereby increasing the drive capability.

It is noted that the embodiment of the method illustrated in FIG. 6 is merely an example. In other embodiments, different operations and different orders of operations are possible and contemplated.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
a plurality of data storage cells, wherein a first subset of the plurality of data storage cells is coupled to a first pair of data lines, wherein a second subset of the plurality of data storage cells is coupled to a second pair of data lines, wherein the second subset of data cells is different than the first subset of data cells; and
wherein each data storage cell of the first subset of the plurality of data storage cells is configured to generate a first differentially encoded output signal on the first pair of data lines in response to an assertion of a respective one of a first plurality of selection signals; and
wherein each data storage cell of the second subset of the plurality of data storage cells is configured to generate a second differentially encoded output signal on the second pair of data lines in response to an assertion of a respective one of a second plurality of selection signals;
circuitry configured to assert a given selection signal from either the first plurality of selection signals or the second plurality of selection signals dependent upon an address value; and
an amplifier circuit coupled to the first pair of data lines, the second pair of data lines, and a global data line, wherein the amplifier circuit is configured to:
amplify the first differentially encoded output signal on the first pair of data lines; and
amplify the second differentially encoded output signal on the second pair of data lines;
wherein the amplifier circuit includes a first pair of n-channel metal-oxide semiconductor field-effect transistors (MOSFETs) and a second pair of n-channel MOSFETs, wherein a gate terminal of each MOSFET of the first pair of MOSFETs is coupled to a respective one of the first pair of data lines, and wherein a gate terminal of each MOSFET of the second pair of MOSFETs is coupled to a respective one of the second pair of data lines;

wherein the circuitry is further configured to enable the amplifier circuit in response to a determination that a predetermined period of time has elapsed since the assertion of the given selection signal.

2. The apparatus of claim 1, wherein to assert the given selection signal, the circuitry is further configured to decode an address included in a received read command.

3. The apparatus of claim 1, wherein to amplify the first differentially encoded output signal on the first pair of data lines, the amplifier circuit is further configured to amplify a difference between a first voltage level of a first data line of the first pair of data lines, and a second voltage level of a second data line of the first pair of data lines.

4. A method, comprising:
receiving a read command for a memory, wherein the memory includes a plurality of banks, a plurality of amplifiers, and wherein each bank of the plurality of banks includes a plurality of data storage cells, wherein each data storage cell of the plurality of data storage cells included in a first bank is coupled to the first pair of data lines, and wherein each data storage cell of the plurality of data storage cells included in a second bank of the plurality banks is coupled to a second pair of data lines;
selecting a given data storage cell of the plurality of data storage cells included in the first bank of the plurality of banks dependent upon the read command; and
amplifying, by a given amplifier of the plurality of amplifiers, a first signal generated by the given data storage cell, wherein the given amplifier is coupled to the first bank of the plurality of banks and the second bank of the plurality of banks, wherein the first signal generated by the given data storage cell is differentially encoded on the first pair of data lines included in the first bank;
wherein each amplifier of the plurality of amplifiers includes a first pair of metal-oxide semiconductor field-effect transistors (MOSFETs) and a second pair of MOSFETs, wherein a gate terminal of each MOSFET of the first pair of MOSFETs is coupled to a respective one of the first pair of data lines, and wherein a gate terminal of each MOSFET of the second pair of MOSFETs is coupled to a respective one of the second pair of data lines; and
wherein amplifying, by the given amplifier, the first signal generated by the given data storage cell comprises amplifying a difference in voltage levels between each data line of the first pair of data lines.

5. The method of claim 4, further comprising generating, by the given amplifier, a second signal on a global data line dependent upon the first signal.

6. The method of claim 4, wherein selecting the given data storage cell comprises decoding an address included in the read command.

7. A system, comprising:
a processor; and
a memory coupled to the processor, wherein the memory includes circuitry, a plurality of banks and a plurality of amplifiers, wherein each bank of the plurality of banks includes a plurality of data storage cells, wherein each data storage cell of the plurality of data storage cells in a first bank is coupled to a first pair of data lines, and wherein each data storage cell of the plurality of data storage cells in a second bank is coupled to a second pair of data lines;
wherein the circuitry is configured to:
receive a read command from the processor; and
select a given data storage cell in the first bank dependent upon the read command;
wherein a given amplifier coupled to the first bank, the second bank, and a global data line is configured to amplify a first signal generated by the given data storage cell, wherein the first signal is differentially encoded on the first pair of data lines;
wherein the given amplifier includes a first pair of n-channel metal-oxide semiconductor field-effect transistors (MOSFETs) and a second pair of n-channel MOSFETs, wherein a gate terminal of each MOSFET of the first pair of MOSFETs is coupled to a respective one of the first pair of data lines, and wherein a gate terminal of each MOSFET of the second pair of MOSFETs is coupled to a respective one of the second pair of data lines; and
wherein the circuitry is further configured to enable the given amplifier circuit in response to a determination that a predetermined period of time has elapsed since the assertion of a selection signal coupled to a particular data storage cell included in first bank.

8. The system of claim 7, wherein to amplify the first signal generated by the given data storage cell, the given amplifier is further configured to amplify a difference in voltage levels between each data line of the first pair of data lines.

9. The system of claim 7, wherein the given amplifier is further configured to generate a second signal on a global data line dependent upon the first signal.

10. The system of claim 7, wherein to select the given data storage cell, the circuitry is further configured to decode an address included in the read command.

* * * * *